United States Patent
Yang et al.

(10) Patent No.: US 9,183,922 B2
(45) Date of Patent: Nov. 10, 2015

(54) EIGHT TRANSISTOR (8T) WRITE ASSIST STATIC RANDOM ACCESS MEMORY (SRAM) CELL

(71) Applicant: NVIDIA Corporation, Santa Clara, CA (US)

(72) Inventors: Jun Yang, Shanghai (CN); Hwong-Kwo Lin, Palo Alto, CA (US); Ju Shen, Shanghai (CN); Yong Li, Shanghai (CN); Hua Chen, Shanghai (CN)

(73) Assignee: NVIDIA Corporation, Santa Clara, CA (US)

( * ) Notice: Subject to any disclaimer, the term of this patent is extended or adjusted under 35 U.S.C. 154(b) by 239 days.

(21) Appl. No.: 13/901,614

(22) Filed: May 24, 2013

(65) Prior Publication Data

US 2014/0347916 A1 Nov. 27, 2014

(51) Int. Cl.
*G11C 11/00* (2006.01)
*G11C 11/412* (2006.01)
*G11C 11/419* (2006.01)

(52) U.S. Cl.
CPC ............ *G11C 11/412* (2013.01); *G11C 11/419* (2013.01)

(58) Field of Classification Search
USPC ........................................................ 365/156
See application file for complete search history.

(56) References Cited

U.S. PATENT DOCUMENTS

| | | | |
|---|---|---|---|
| 5,978,279 A | 11/1999 | Park | |
| 6,757,205 B2 | 6/2004 | Salters | |
| 6,778,462 B1 | 8/2004 | Castagnetti et al. | |
| 7,164,596 B1 * | 1/2007 | Deng et al. | 365/154 |
| 7,400,523 B2 | 7/2008 | Houston | |
| 7,533,222 B2 | 5/2009 | Leung | |
| 7,626,854 B1 | 12/2009 | Yang et al. | |
| 7,626,871 B1 | 12/2009 | Yang et al. | |
| 7,643,330 B1 | 1/2010 | Lin et al. | |
| 7,768,816 B2 * | 8/2010 | Joshi et al. | 365/154 |
| 7,852,661 B2 * | 12/2010 | Liu | 365/154 |
| 8,004,907 B2 | 8/2011 | Russell et al. | |
| 8,072,797 B2 * | 12/2011 | Sachdev et al. | 365/154 |
| 8,320,163 B2 | 11/2012 | Lee | |
| 8,325,543 B2 | 12/2012 | Chan et al. | |
| 8,325,549 B2 | 12/2012 | Chan et al. | |
| 8,339,838 B2 | 12/2012 | Ramaraju | |
| 8,345,469 B2 | 1/2013 | Pelley et al. | |
| 8,363,453 B2 | 1/2013 | Arsovski et al. | |
| 8,370,557 B2 | 2/2013 | Dama et al. | |
| 8,427,896 B1 | 4/2013 | Agarwal et al. | |

(Continued)

FOREIGN PATENT DOCUMENTS

EP 0821365 A1 1/1998
WO 2009030169 A1 3/2009

*Primary Examiner* — Hoai V Ho
*Assistant Examiner* — Pablo Huerta
(74) *Attorney, Agent, or Firm* — Zilka-Kotab, PC (57) ABSTRACT

Disclosed are devices, systems and/or methods relating to an eight transistor (8T) static random access memory (SRAM) cell, according to one or more embodiments. In one embodiment, an SRAM storage cell is disclosed comprising a word line, a write column select line, a cross-coupled data latch, and a first NMOS switch device serially coupled to a second NMOS switch device. In this embodiment, the gate node of the first NMOS switch device is coupled to the word line, a source node of the first NMOS switch device is coupled to the cross-coupled data latch, a gate node of the second NMOS switch device is coupled to the write column select line, and a source node of the second NMOS switch device is coupled to the cross-coupled data latch.

11 Claims, 6 Drawing Sheets

(56) References Cited

U.S. PATENT DOCUMENTS

| | | | |
|---|---|---|---|
| 2007/0025162 A1* | 2/2007 | Deng et al. | 365/189.09 |
| 2009/0147560 A1* | 6/2009 | Joshi et al. | 365/154 |
| 2010/0097844 A1* | 4/2010 | Liu | 365/156 |
| 2012/0014194 A1* | 1/2012 | Deng | 365/189.14 |
| 2012/0243302 A1* | 9/2012 | Nii et al. | 365/154 |

* cited by examiner

EIGHT TRANSISTOR (8T) WRITE ASSIST STATIC RANDOM ACCESS MEMORY (SRAM) CELL

FIELD OF TECHNOLOGY

This disclosure relates generally to integrated circuits, and more specifically, to memory circuit designs and memory circuit cells.

BACKGROUND

The minimum voltage at which an integrated circuit (IC) can reliably operate is referred to as the IC's VCC_min. As the proliferation of mobile devices have driven up the demand for scaled-down ICs and processors that consume less power, the VCC_min of most ICs have continued to decrease. However, this trend of ever decreasing VCC_min has taken a toll on the reliability of certain IC components. For example, ICs often embed and employ a static random access memory (SRAM) circuit to handle on-chip storage needs. The SRAM cell is often arranged as an array comprising rows and columns. In a conventional SRAM cell, each row of the cell is coupled to a word line and each column is coupled to a pair of bit-lines. As the VCC_min of SRAM circuits decrease, the read and write operation margins of the underlying SRAM cell also decrease due to voltage noise.

Various solutions to this problem have been proposed to maintain the reliability of write operations at reduced VCC_min. These include: VDD lowering, VSS raising, word-line boosting, and negative bit-line manipulations. However, all such solutions are geared toward traditional six transistor (6T) SRAM cells and require peripheral circuitry that may further complicate memory design, consume more dynamic power, and affect unselected cells in the same row. Moreover, solutions that embed write assist into the SRAM cell structure have faced significant DC current problems that have an adverse impact on unselected cells. Therefore, a design solution is needed that addresses the above mentioned problems.

SUMMARY

Disclosed are devices, systems and/or methods relating to an eight transistor (8T) static random access memory (SRAM) cell, according to one or more embodiments. In one aspect, an SRAM storage cell is disclosed comprising a word line, a write column select line, a cross-coupled data latch, and a first NMOS switch device serially coupled to a second NMOS switch device. In this aspect, the gate node of the first NMOS switch device is coupled to the word line, a source node of the first NMOS switch device is coupled to the cross-coupled data latch, a gate node of the second NMOS switch device is coupled to the write column select line, and a source node of the second NMOS switch device is coupled to the cross-coupled data latch.

In another aspect, an integrated circuit is disclosed comprising a plurality of input/output circuits, a core logic circuit, and an SRAM circuit comprising one or more SRAM storage cells. In this aspect, at least one of the one or more SRAM storage cells comprises a word line, a write column select line, a cross-coupled data latch, and a first NMOS switch device serially coupled to a second NMOS switch device. In this aspect, a gate node of the first NMOS switch device is coupled to the word line, a source node of the first NMOS switch device is coupled to the cross-coupled data latch, a gate node of the second NMOS switch device is coupled to the write column select line, and a source node of the second NMOS switch device is coupled to the cross-coupled data latch.

In yet another aspect, a method is disclosed to assist a write operation of an SRAM circuit comprising: initiating, by a control circuit of the SRAM circuit, a write column select signal to an SRAM storage cell of the SRAM circuit through a write column select line; initiating, by a control circuit of the SRAM circuit, a word line signal to the SRAM storage cell through a word line after a time period has elapsed since the write column select signal has been initiated; and providing an extra current path between a first storage node and a second storage node of the SRAM storage cell during a write operation.

The methods, system, and/or apparatuses disclosed herein may be implemented in any means for achieving the various aspects. Other features will be apparent from the accompanying drawings and from the detailed description that follows.

BRIEF DESCRIPTION OF THE DRAWINGS

Example embodiments are illustrated by way of example and not limited by the figures of the accompanying drawings, in which like references indicate similar elements.

Other features of the present embodiments will be apparent from the accompanying drawings and from the detailed description that follows.

DETAILED DESCRIPTION

Disclosed are methods, devices and/or systems relating to an eight transistor (8T) static random access memory (SRAM) cell. Although the present embodiments have been described with reference to specific example embodiments, it will be evident that various modifications and changes may be made to these embodiments without departing from the broader spirit and scope of the various embodiments.

Figure 1:
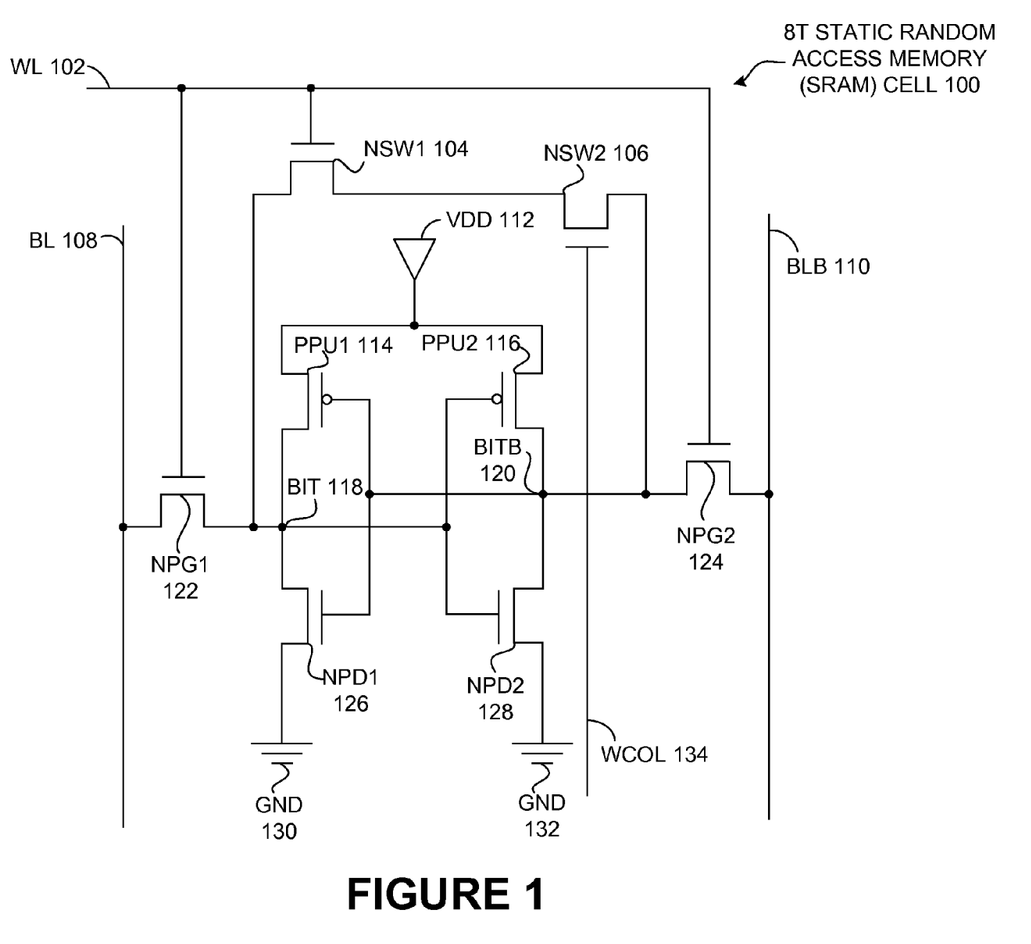
FIG. 1 illustrates a circuit design of an eight transistor (8T) static random access memory (SRAM) cell, according to one or more embodiments.

Reference is now made to FIG. 1, which illustrates a circuit design of an 8T SRAM cell 100, according to one or more embodiments. In one embodiment, the 8T SRAM cell 100 comprises a word line (WL) 102, a row-controlled N-channel MOSFET (NMOS) switch device (NSW1) 104 serially coupled to a column-controlled NMOS switch device (NSW2) 106, a bit line (BL) 108, a bit line bar (BLB) 110, a first P-channel MOSFET (PMOS) pull up device (PPU1) 114, a second PMOS pull device (PPU2) 116, a first NMOS pass gate (NPG1) 122, a second NMOS pass gate (NPG2) 124, a first NMOS pull down device (NPD1) 126, a second NMOS pull down device (NPD2) 128, and a write column select line (WCOL) 134. In such an embodiment, the WL 102 is coupled to the gate nodes of NSW1 104, NPG1 122, and NPG2 124. In this embodiment, the drain node of NSW1 104 is coupled to the drain node of NSW2 106.

Furthermore, as illustrated in FIG. 1, the drain node of NPG1 122 is coupled to BL 108 and the drain node of NPG2 124 is coupled to BLB 110, according to one embodiment. In this embodiment, the drain of PPU1 114 is coupled to the drain of NPD1 126 to form a first logic inverter and the drain of PPU2 116 is coupled to the drain of NPD2 128 to form a second logic inverter. Additionally, the source of NPD1 126 is coupled to VSS ground (GND) 130 and the source of NPD2 128 is coupled to GND 132. The first logic inverter and the second logic inverter are cross-coupled (meaning the output of the first logic inverter is coupled to the input of the second logic inverter, and vice versa) to form a cross-coupled data latch for storing one bit of data. In one or more embodiments, the cross-coupled data latch may utilize a two-stage high-gain feedback loop to store this one bit of data.

In addition, the sources of PPU1 114 and PPU2 116 are coupled to VDD 112. In one embodiment, VDD 112 may be an operating supply voltage provided to an IC incorporating the 8T SRAM cell 100. In another embodiment, VDD 112 may be an operating supply voltage provided in a converted form. As illustrated in FIG. 1, the drains of PPU1 114 and NPD1 126 and the sources of NPG1 122 and NSW1 104 may be coupled together to form storage node bit (BIT) 118. Moreover, the drains of PPU2 116 and NPD2 128 and the sources of NPG2 124 and NSW2 106 may be coupled together to form storage node bit bar (BITB) 120. In this embodiment, BIT 118 and BITB 120 are complementary storage nodes where BIT 118 represents a non-inverted representation (or positive sense) of the one bit of data stored on the cross-coupled latch and BITB 120 represents an inverted representation (or negative sense) of the one bit of data stored on the cross-coupled latch.

Since WL 102 is coupled to both the gate nodes of NPG1 122 and NPG2 124, data stored on BIT 118 may be accessed on BL 108 through NPG1 122 and data stored on BITB 120 may be accessed on BLB 110. In one or more embodiments, WL 102 may be used to drive certain read and write operations of the 8T SRAM cell 100. In the embodiment illustrated in FIG. 1, WL 102 is used to select the appropriate row for write operations. Additionally, in this embodiment, WCOL 134 is coupled to the gate node of NSW2 106 and is used to select the appropriate column for write operations. Along with serially coupled NSW1 104 (the row controlled NMOS switch) and NSW2 106 (the column controlled NMOS switch), WCOL 134 and WL 102 provide the controls needed to assist the 8T SRAM cell 100 with a write operation.

In a traditional SRAM cell (for example, a 6T SRAM cell), the NMOS pass gate is constantly competing with the PMOS pull up device to flip the storage nodes. In the case where the NMOS pass gate is stronger than the PMOS pull up device, a successful write operation may be undertaken. However, when VCC_min is reduced, the NMOS pass gate has a more difficult time overcoming the PMOS pull device. While solutions have been devised that involve VDD lowering, VSS raising, word-line boosting, and negative bit-line manipulations, all such write-assist solutions require the introduction of peripheral circuitry that further complicates memory design, consumes more dynamic power, and affects unselected cells in the same row. The embodiments disclosed in the present disclosure overcomes these reduced VCC_min write assist problems by relying on an embedded write-assist solution comprising of the aforementioned write column select line (WCOL 134) coupled to the gate node of a column controlled NMOS switch device (NSW2 106) serially coupled to a row controlled NMOS switch device (NSW1 104).

In one or more embodiments, during a write operation, WL 102 is at VCC for the selected row and WCOL 134 is also at VCC for the selected column. For the selected cell, both NSW1 104 and NSW2 106 are on and the current path between BIT 118 and BITB 120 are on. Thus, in this embodiment where a "0" is stored, a current path exists from PPU2 116 to NSW2 106, NSW1 104, and NPD1 126 for the selected cell so BIT 118 is pulled up from a strong "0" (or logic low) to a weaker "0" by BITB 120. Additionally, BITB 120 is pulled down from a strong "1" (or logic high) to a weaker "1" by BIT 118. Since both stored 0s and 1s become weaker, the write operation becomes easier and a write-assist is undertaken. As will be shown in the figures that follow, in one or more embodiments, a control circuit also aids in the write-assist process by initiating a write column select signal prior to a write line signal.

Furthermore, during a read operation, WCOL 134 is at ground and NSW2 106 is turned off so the current path between nodes BIT 118 and BITB 120 is switched off, regardless of whether WL 102 is driven on or off. Thus, the embedded write-assist circuitry of the 8T SRAM cell 100 disclosed in one or more embodiments of the present disclosure do not adversely affect a read operation performed by the cell.

Figure 2:
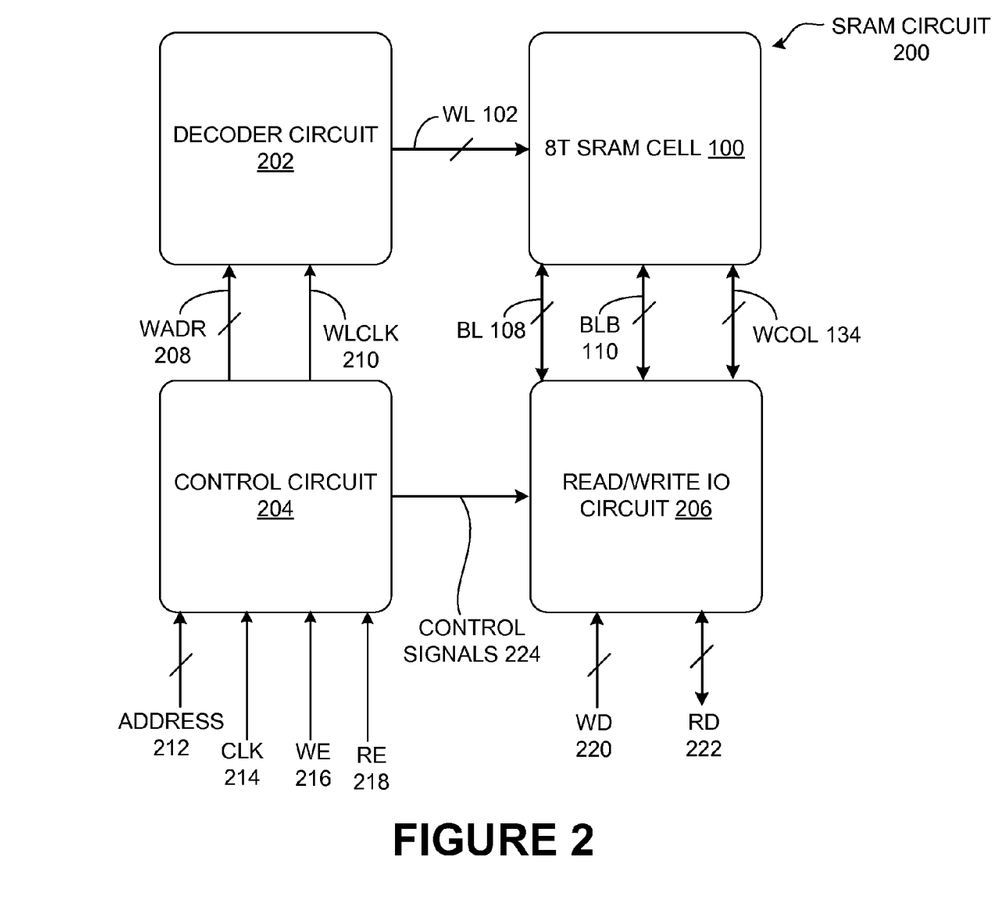
FIG. 2 depicts a simplified block diagram of an SRAM circuit incorporating the 8T SRAM cell, according to one or more embodiments.

Reference is now made to FIG. 2, which depicts a simplified block diagram of an SRAM circuit 200 incorporating the 8T SRAM cell 100, according to one or more embodiments. In one embodiment, WL 102 may be coupled to a row of SRAM cells, including the 8T SRAM cell 100 presented in this disclosure. In one embodiment, the SRAM circuit 200 comprises a decoder circuit 202, a control circuit 204, a read and write input/output circuit (read/write IO) 206, and one or more 8T SRAM cells 100. In one or more embodiments, the 8T SRAM cells 100 may form an SRAM storage cell array. In the embodiment depicted in FIG. 2, SRAM circuit 200 may include input/output ports for at least one write address (ADDRESS) 212, clock (CLK) 214, write enable (WE) 216, and read enable (RE) 218.

In this embodiment, the control circuit 204 receives signals related to ADDRESS 212, CLK 214, WE 216, and RE 218 and generates output signals to the decoder circuit 202 and the read/write IO 206. In another embodiment, the control circuit 204 may also receive signals related to read address and/or read enable. As shown in the embodiment depicted in FIG. 2, control circuit 204 generates control signals 224 for controlling the read and write circuitry embedded in the read/write IO 206. In one or more embodiments, the control signals 224 may comprise timing pulses used to initiate a read operation, a write operation, and/or a write-assist operation. The control circuit 204 may also generate write address bits (WADR) 208 and word line clock (WLCLK) 210. Not shown in FIG. 2 are write enable bits, read address bits, and/or read enable bits that may also be generated by the control circuit 204. In one or more embodiments, a number of least significant address bits from ADDRESS 212 may be used to generate control signals 224 while the remaining upper address bits from ADDRESS 212 may be used to generate WADR 208.

In one embodiment, the decoder circuit 202 decodes WADR 208 into WL 102 whereby one unique word line may be enabled for each code available on WADR 208. Similarly, read address bits (not shown in FIG. 2), which are enabled by RE 218, may be decoded into WL 102. In one embodiment, the WLCLK 210, may be relied on to provide further gating or decoding functions.

The 8T SRAM cell 100 depicted in FIG. 2 may be implemented as one SRAM storage cell or an array of such cells. Data is written to the cell when an associated word line within WL 102 selects the row containing the cell and one or more associated bit lines, such as BL 108 are driven with a data value by the write circuitry of read/write IO 206 to be written. Additionally, data may be read from the 8T SRAM cell 100 when an associated word line within WL 102 selects the row containing the memory cell and the associated bit lines are read by the read circuitry of read/write IO 206. An entire row may be selected and one or more bits may be read by a read operation.

Except for the selected 8T SRAM cell(s), other cells in the same row of the activated WL 102 in unselected columns are unaffected as the WCOL 134 of these unselected cells are inactivated and their current path is cut off. Similarly, other cells in the selected column are also not affected as their WL 102 is inactivated, thus, cutting off their current paths.

Figure 3:
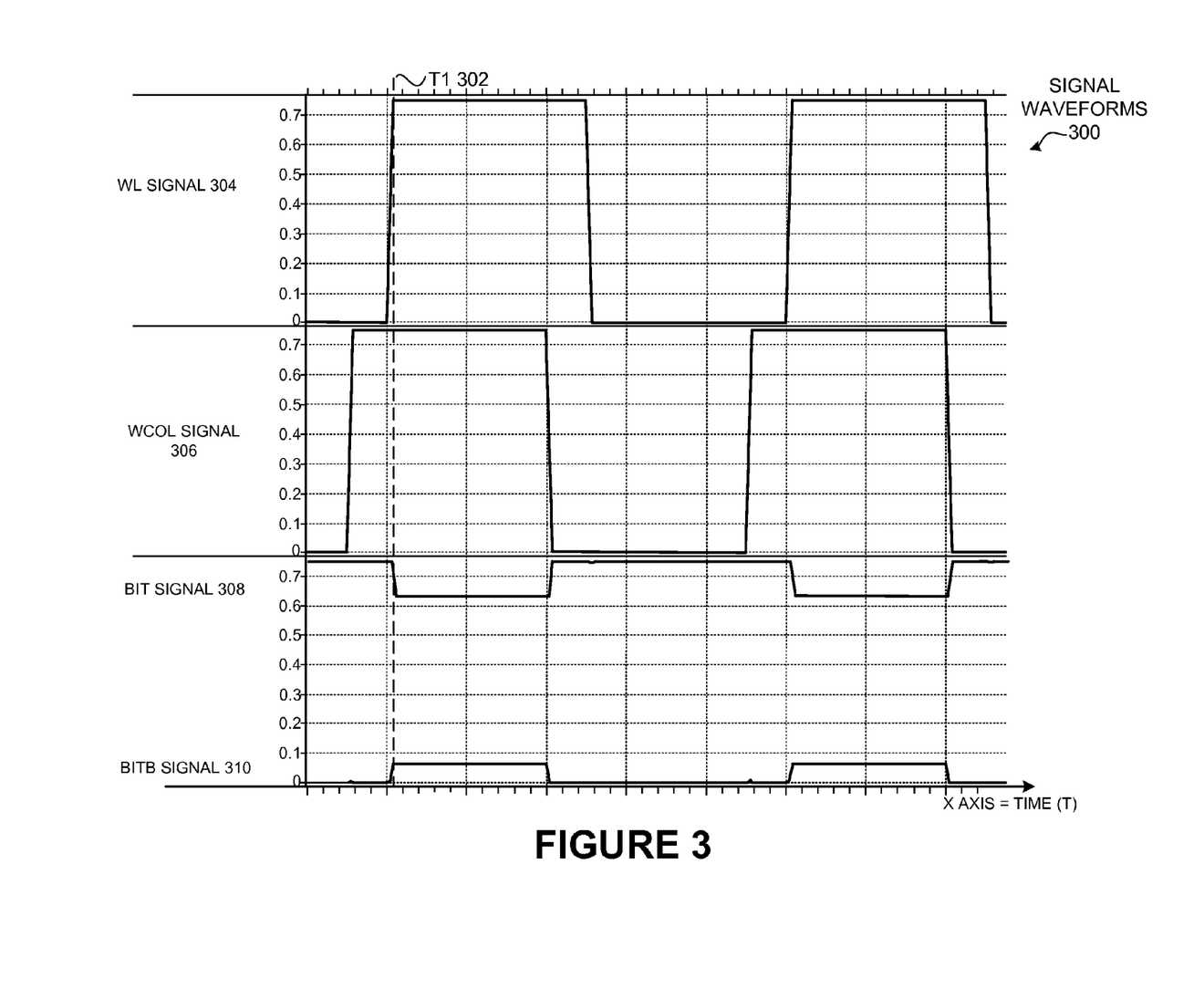
FIG. 3 illustrates a set of waveforms during a standby mode of operation of the 8T SRAM cell, according to one or more embodiments.

Reference is now made to FIG. 3, which illustrates a set of waveforms during a standby mode of operation of the 8T SRAM cell 100, according to one or more embodiments. As shown by BIT signal 308 of FIG. 3, before time T1 302, BIT 118 is at VCC (or more specifically, at 750 mV) and BITB 120 is at 0 mV. During this same time period, the voltages of BL 108 and BLB 110 remain floating. Once both WL 102 and WCOL 134 (as indicated by WL signal 304 and WCOL signal 306, respectively) are driven to VCC at time T1 302, both NSW1 104 and NSW2 106 are switched on and BIT signal 308 drops from VCC to approximately 633 mV and BITB signal 310 rises from 0 to approximately 65 mV. Thus, in this embodiment, the Vgs of NPD2 128 and PPU 1 114 are reduced by approximately 117 mV and 65 mV, respectively. As a result, both the "1" (logic high) and "0" (logic low) stored previously in BIT 118 and BITB 120, respectively, are weakened, providing an assist for the write operation. In one or more embodiments, the current path fights with the regenerative/forward amplifying feature of the latch and quickly reaches and stays at a balance point as long as both WCOL 134 and WL 102 are kept high. It may be apparent to one skilled in the art that the BIT signal 308 drops more than the BITB signal 310 rises. This is because NMOS transistors are used to implement NSW1 104 and NSW2 106, which favors passing a strong "0."

Figure 4:
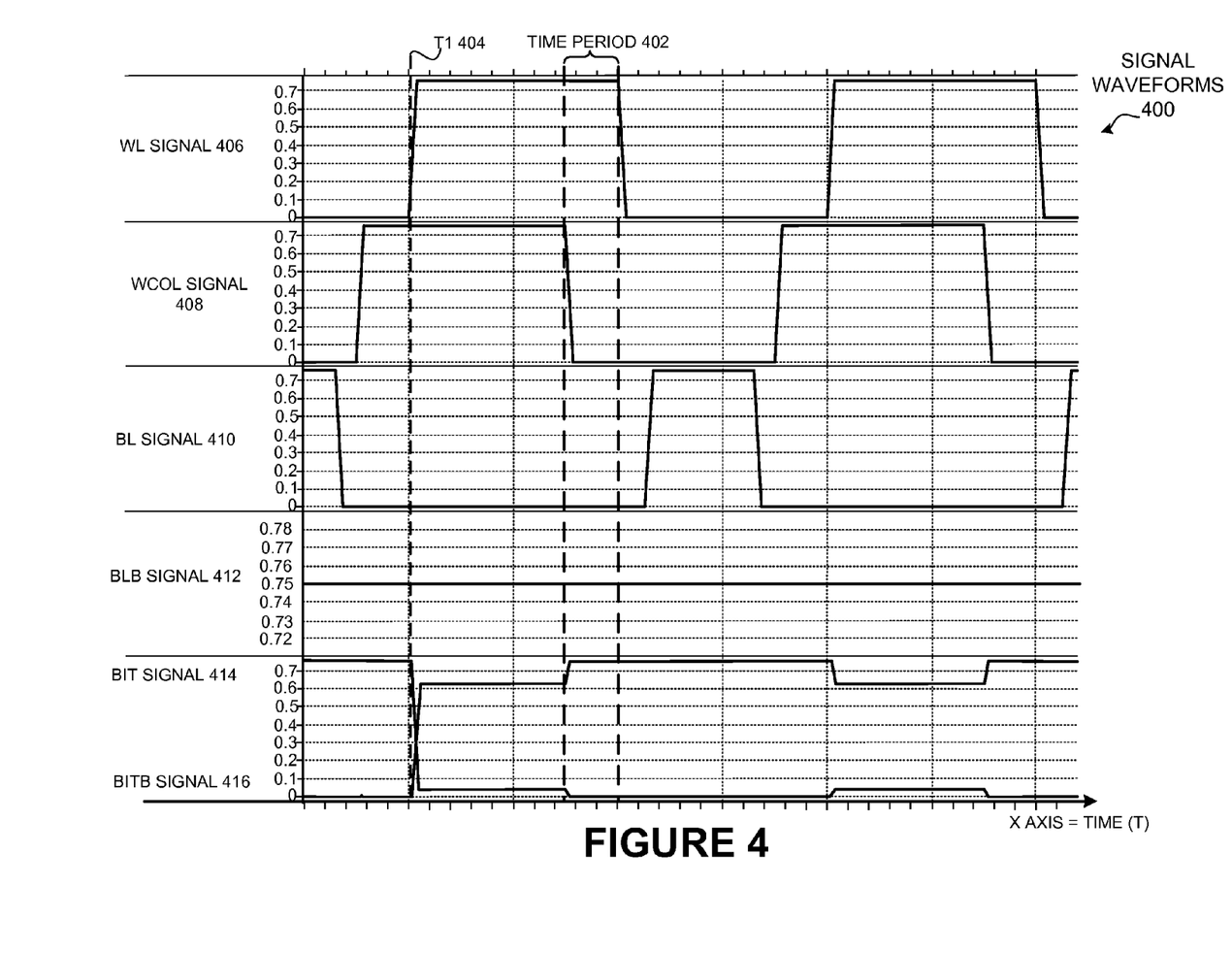
FIG. 4 illustrates a set of waveforms during a write operation assisted by the 8T SRAM cell, according to one or more embodiments.

Reference is now made to FIG. 4, which illustrates a set of waveforms during a write operation assisted by the 8T SRAM cell 100, according to one or more embodiments. FIG. 4 shows two cycles of a write operation. In both cycles, the BL signal 410 goes to ground before the WCOL signal 408 rises and the BL signal 410 returns to VCC after the WL signal 406 falls. In all such cycles, the BLB signal 412 stays at VCC. As can be seen in FIG. 4, prior to time T1 404, BIT 118 is at VCC (or 750 mV) and BIB 120 is at 0 mV. Thus, each of the two write cycles writes a "0" (or logic low) into the cell. As can be seen in the WL signal 406 waveform, when WL 102 is activated after T1 404, both WCOL 134 and WL 102 are at VCC (as can be seen in the WL signal 406 and the WCOL signal 408 waveforms) and the SRAM cell toggles. However, even after such toggling, the BIT 118 and BITB 120 voltages (as can be seen in the BIT signal 414 waveforms and BITB signal 416 waveforms) cannot reach their strongest "0" and "1," respectively before the WCOL 134 goes low. This is because the current path is, in this case, fighting against the write data after it finishes helping the cell toggle. As can be seen in their respective waveforms in FIG. 4, BIT 118 toggles from a strong "1" to a weaker "0" (approximately 40 mV) and BITB 120 toggles from a strong "0" to a weaker "1" (approximately 621 mV). It may be observed that voltage values of the weaker "1" and "0" in FIG. 4 differ from that of the weaker "1" and "0" shown in FIG. 3. This is likely due to the fact that BL 108 and BLB 110 are floating prior to the write operation and are driven to ground and VCC, respectively, during the write operation.

As can be seen in FIG. 4, after WCOL 134 goes low (as shown in the WCOL signal 408), one way to raise the weaker "0" and "1" to a strong "0" and "1" is by lining up the WCOL pulse and the WL pulse (for example, by activating and de-activating WCOL 134 and WL 102 simultaneously). By doing so, the voltage delta between the weak "0" and "1" may be amplified by the cell's internal latch. However, such an approach presents two problems. First, since the BIT 118 and BITB 120 voltage delta may be amplified after WL 102 closes, this may adversely affect the timing of next cycle's read operation. Second, it may be possible that the natural fluctuations of the SRAM device can cause the amplification step to fail if the voltage delta between the weak "0" and weak "1" does not exceed a threshold value.

In the embodiment depicted in FIG. 4, this problem is solved by initiating a WCOL signal before a WL signal by a time period 402. In one embodiment, this time period 402 may be the amount of time needed so that the write operation can be done within the WL high phase. As depicted in the example embodiment shown in FIG. 4, a control circuit (such as control circuit 204) drives WCOL 134 from VCC (750 mV) to ground (0 mV) at the start of time period 402 and WL 102 from VCC (760 mV) to ground (0 mV) at the end of time period 402. In one or more embodiments, this time period 402 may be 100 ps. The benefits to this approach include having no adverse timing impact on next cycle's read operation and being able to function correctly even under conditions where the voltage delta between BIT 118 and BITB 120 is quite small. As may be evident to one skilled in the art of memory design, when WCOL 134 goes low in this embodiment, the current path is disabled while WL 102 is still high. Thus, NPG1 122 is still on so it is still discharging (and holding it to a lower state) during this process. Hence, this NPG1 122 joins the amplification process of the back to back inverters and ensures a proper write operation is carried out.

Simulations of the embodiments proposed in this disclosure were carried out on SRAM cells sized as PPU:NPG:NPD:NSW1:NSW2=1:1:2:1:1 and an improvement was shown in the form of a VCC reduction of 51 mV (that is, from a VCC_min of 468 mV to 417 mV). Simulations on cells sized as PPU:NPG:NPD=1:1:2 showed that such cells failed at 468 mV. In such simulations, it was shown that the embodiments disclosed herein operated best under a slow N fast P process corner at 0° C.

Figure 5:
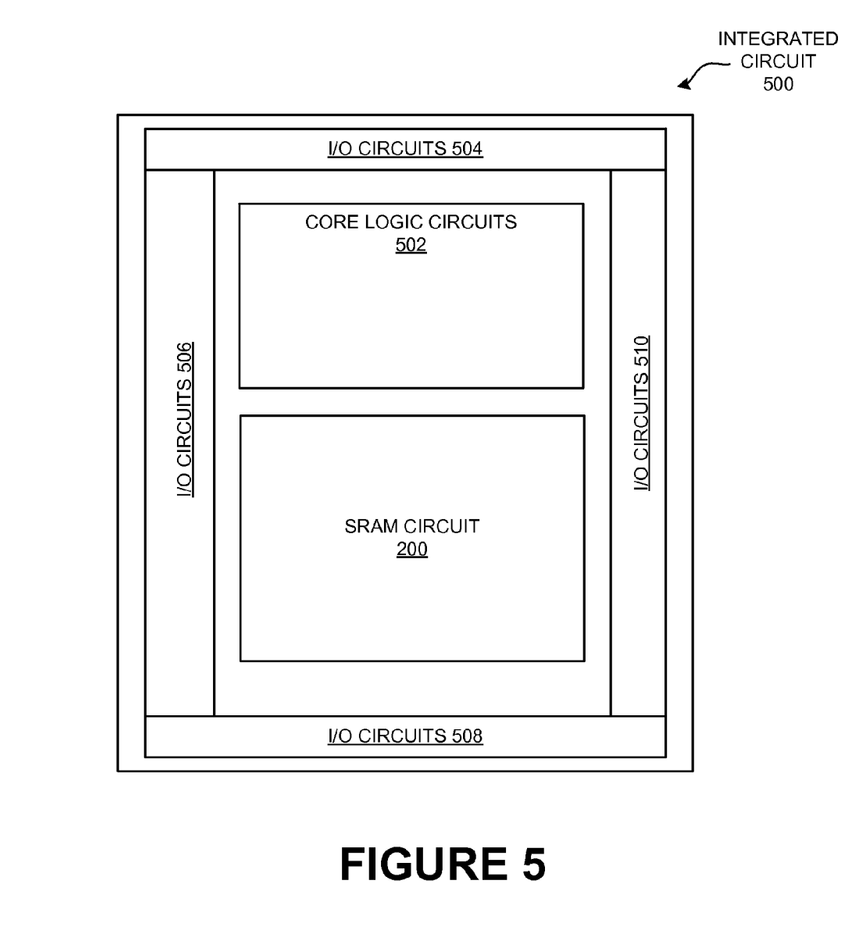
FIG. 5 depicts an integrated circuit in which one or more embodiments of the present disclosure may be implemented.

Reference is now made to FIG. 5, which depicts an integrated circuit in which one or more embodiments of the present disclosure may be implemented. The integrated circuit 500 may comprise at least one SRAM memory circuit 200, core logic circuits 502, as well as input/output circuits 504, 506, 508, and 510. All such components of the integrated circuit 500 may be coupled using any conductive material know to those with ordinary skill in the art. The input/output circuits 504, 506, 508, and 510 may be used to transmit signals on and off the IC chip. The core logic circuits 502 may compute logic equations and store certain results. The SRAM memory circuit 200 may be configured to store and retrieve data in response to one or more operations of the core logic circuits 502. In one or more embodiments, the integrated circuit 500 may be any IC that requires memory storage in the form of SRAM.

Figure 6:
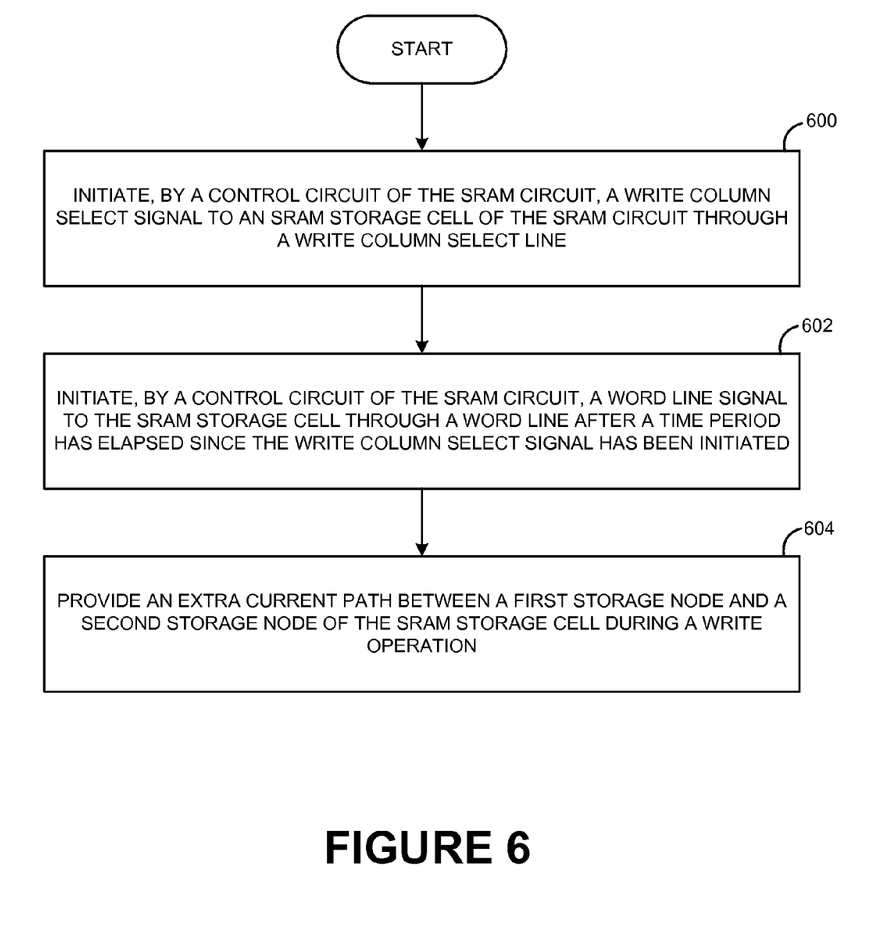
FIG. 6 depicts a process flow diagram depicting a method to assist a write operation of an SRAM circuit, according to one or more embodiments.

Reference is now made to FIG. 6, which depicts a process flow diagram of a method to assist a write operation of an SRAM circuit, according to one or more embodiments. In one embodiment, operation 600 of the method comprises initiating, by the control circuit 204 of the SRAM circuit 200, a write column select signal to an SRAM storage cell (for example, the 8T SRAM cell 100) of the SRAM circuit 200 through a write column select line 134. In this embodiment, operation 602 involves initiating, by the control circuit 204 of the SRAM circuit 200, a word line signal to the SRAM storage cell (for example, the 8T SRAM cell 100) through a word line 102 after a time period has elapsed since the write column select signal has been initiated. In this embodiment, operation 604 involves providing an extra current path between a first storage node (for example, BIT 118) and a second storage node (for example, BITB 120) of the SRAM storage cell (for example, the 8T SRAM cell 100) during a write operation.

In one or more embodiments, the time period may be the amount of time needed to conduct a write operation during a high phase of the word line signal. Additionally, the SRAM storage cell may be the 8T SRAM cell 100 with all of the components and functionalities discussed in the present disclosure.

In summary, one or more embodiments of the present disclosure comprises imposing both word line and write column select line controls on an 8T SRAM cell comprising an NMOS row controlled switch device serially coupled to an NMOS column controlled switch device. Other features of the embodiments are as described in the disclosure herein.

Although the present embodiments have been described with reference to specific example embodiments, it will be evident that various modifications and changes may be made to these embodiments without departing from the broader spirit and scope of the various embodiments. For example, aspects of the present disclosure may be implemented in complementary symmetry metal oxide semiconductor (CMOS) fabrication technology or other related fabrication technologies.

What is claimed is:

1. A static random access memory (SRAM) storage cell, comprising:
   a word line;
   a write column select line;
   a cross-coupled data latch,
   wherein the cross-coupled data latch comprises an output of a first logic inverter coupled to an input of a second logic inverter and an output of the second logic inverter coupled to an input of the first logic inverter;
   a first NMOS switch device serially coupled to a second NMOS switch device,
   wherein a gate node of the first NMOS switch device is coupled to the word line, a source node of the first NMOS switch device is coupled to the cross-coupled data latch, a gate node of the second NMOS switch device is coupled to the write column select line, and a source node of the second NMOS switch device is coupled to the cross-coupled data latch;
   a first bit line coupled to a drain node of a first NMOS pass gate;
   a second bit line coupled to a drain node of a second NMOS pass gate, wherein a source node of the first NMOS pass gate is coupled to the cross-coupled data latch and a source node of the second NMOS pass gate is coupled to the cross-coupled data latch;
   a first storage node comprising a source node of the first NMOS pass gate coupled to a source node of the first NMOS switch device and the first logic inverter; and
   a second storage node comprising a source node of the second NMOS pass gate coupled to a source node of the second NMOS switch device and the second logic inverter.

2. The SRAM storage cell of claim 1, wherein the first logic inverter comprises a source node of a first PMOS pull up device coupled to a voltage source, a drain node of the first PMOS pull up device coupled to a drain node of a first NMOS pull down device, and a source node of the first NMOS pull down device coupled to ground.

3. The SRAM storage cell of claim 1, wherein the second logic inverter comprises a source node of a second PMOS pull up device coupled to a voltage source, a drain node of the second PMOS pull up device coupled to a drain node of a second NMOS pull down device, and a source node of the second NMOS pull down device coupled to ground.

4. The SRAM storage cell of claim 1, wherein an extra current path exists between the first storage node and the second storage node during a write operation.

5. The SRAM storage cell of claim 1, wherein the write column select line is configured to receive a write column select signal prior to the word line receiving a word line signal.

6. An integrated circuit, comprising:
   a plurality of input/output circuits;
   a core logic circuit; and
   a static random access memory (SRAM) circuit comprising one or more SRAM storage cells, wherein at least one of the one or more SRAM storage cells comprises:
      a word line,
      a write column select line,
      a cross-coupled data latch,
      wherein the cross-coupled data latch of the SRAM storage cell comprises an output of a first logic inverter coupled to an input of a second logic inverter and an output of the second logic inverter coupled to an input of the first logic inverter, and
      a first NMOS switch device serially coupled to a second NMOS switch device,
      wherein a gate node of the first NMOS switch device is coupled to the word line, a source node of the first NMOS switch device is coupled to the cross-coupled data latch, a gate node of the second NMOS switch device is coupled to the write column select line, and a source node of the second NMOS switch device is coupled to the cross-coupled data latch,
      a first bit line coupled to a drain node of a first NMOS pass gate of the SRAM storage cell,
      a second bit line coupled to a drain node of a second NMOS pass gate of the SRAM storage cell, wherein a source node of the first NMOS pass gate is coupled to the cross-coupled data latch and a source node of the second NMOS pass gate is coupled to the cross-coupled data latch,
      a first storage node of the SRAM storage cell comprising a source node of the first NMOS pass gate coupled to a source node of the first NMOS switch device and the first logic inverter, and
      a second storage node of the SRAM storage cell comprising a source node of the second NMOS pass gate coupled to a source node of the second NMOS switch device and the second logic inverter.

7. The integrated circuit of claim 6, wherein:
   the first logic inverter of the SRAM storage cell comprises a source node of a first PMOS pull up device coupled to a voltage source, a drain node of the first PMOS pull up device coupled to a drain node of a first NMOS pull down device, and a source node of the first NMOS pull down device coupled to ground; and the second logic inverter of the SRAM storage cell comprises a source node of a second PMOS pull up device coupled to a voltage source, a drain node of the second PMOS pull up device coupled to a drain node of a second NMOS pull down device, and a source node of the second NMOS pull down device coupled to ground.

8. The integrated circuit of claim 6, wherein an extra current path exists between the first storage node and the second storage node during a write operation.

9. The integrated circuit of claim 6, wherein the write column select line is configured to receive a write column select signal from a read and write input/output circuit of the SRAM circuit prior to the word line receiving a word line signal from a decoder circuit of the SRAM circuit.

10. A method to assist a write operation of a static random access memory (SRAM) circuit, comprising:

initiating, by a control circuit of the SRAM circuit, a write column select signal to an SRAM storage cell of the SRAM circuit through a write column select line;

initiating, by a control circuit of the SRAM circuit, a word line signal to the SRAM storage cell through a word line after a time period has elapsed since the write column select signal has been initiated; and providing an extra current path between a first storage node and a second storage node of the SRAM storage cell during a write operation;

wherein the SRAM storage cell, comprises:
a word line;
a write column select line;
a cross-coupled data latch,
wherein the cross-coupled data latch comprises an output of a first logic inverter coupled to an input of a second logic inverter and an output of the second logic inverter coupled to an input of the first logic inverter;
a first NMOS switch device serially coupled to a second NMOS switch device, wherein a gate node of the first NMOS switch device is coupled to the word line, a source node of the first NMOS switch device is coupled to the cross-coupled data latch, a gate node of the second NMOS switch device is coupled to the write column select line, and a source node of the second NMOS switch device is coupled to the cross-coupled data latch;

a first bit line coupled to a drain node of a first NMOS pass gate of the SRAM storage cell;

a second bit line coupled to a drain node of a second NMOS pass gate, wherein a source node of the first NMOS pass gate is coupled to the cross-coupled data latch and a source node of the second NMOS pass gate is coupled to the cross-coupled data latch;

the first logic inverter comprises a source node of a first PMOS pull up device coupled to a voltage source, a drain node of the first PMOS pull up device coupled to a drain node of a first NMOS pull down device, and a source node of the first NMOS pull down device coupled to ground;

the second logic inverter comprises a source node of a second PMOS pull up device coupled to a voltage source, a drain node of the second PMOS pull up device coupled to a drain node of a second NMOS pull down device, and a source node of the second NMOS pull down device coupled to ground;

the first storage node comprises a source node of the first NMOS pass gate coupled to a source node of the first NMOS switch device and the first logic inverter; and the second storage node comprises a source node of the second NMOS pass gate coupled to a source node of the second NMOS switch device and the second logic inverter.

11. The method of claim 10, wherein the time period is the amount of time needed to conduct a write operation during a high phase of the word line signal.

* * * * *